United States Patent
Pan

(10) Patent No.: US 6,734,718 B1
(45) Date of Patent: May 11, 2004

(54) HIGH VOLTAGE RIPPLE REDUCTION

(75) Inventor: Feng Pan, San Jose, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 10/328,686

(22) Filed: Dec. 23, 2002

(51) Int. Cl.[7] .................................................. G06F 1/10
(52) U.S. Cl. ....................................................... 327/536
(58) Field of Search ................................. 327/530, 534, 327/535, 536, 537

(56) References Cited

U.S. PATENT DOCUMENTS

| | | | |
|---|---|---|---|
| 4,511,811 A | 4/1985 | Gupta | 307/463 |
| 4,636,748 A | 1/1987 | Latham | 331/17 |
| 4,736,121 A | 4/1988 | Cini et al. | 307/296 |
| 5,392,205 A | 2/1995 | Zavaleta | 363/59 |
| 5,436,587 A | 7/1995 | Cernea | 327/536 |
| 5,625,544 A | 4/1997 | Kowshik et al. | 363/59 |
| 5,969,565 A * | 10/1999 | Naganawa | 327/536 |
| 6,188,590 B1 | 2/2001 | Chang et al. | 363/60 |
| 6,285,725 B1 | 9/2001 | Sung et al. | 375/374 |
| 6,370,046 B1 | 4/2002 | Nebrigic et al. | 363/60 |
| 6,370,075 B1 | 4/2002 | Haeberli et al. | 365/226 |
| 6,434,028 B1 * | 8/2002 | Takeuchi et al. | 363/59 |
| 6,445,243 B2 | 9/2002 | Myono | 327/536 |

* cited by examiner

*Primary Examiner*—Jeffrey Zweizig
(74) *Attorney, Agent, or Firm*—Parsons Hsue & de Runtz LLP

(57) ABSTRACT

In a non-volatile memory, charge pumps are used to provide high voltages needed for programming memory cells that have floating gate structures. Charge pumps have a series of voltage multiplier stages in series to boost voltage. These charge pumps must rapidly charge a load to a high voltage and then maintain a voltage with a high degree of stability. Techniques for achieving both of these goals are presented. In one aspect, a charge pump has two operating states, one to charge a load rapidly and a second to maintain a voltage on a charged load with high stability. These states are achieved by changing the current output from a high current during charging to a low current to maintain the voltage. This is done by changing the capacitance used in the individual voltage multiplier stages. In another aspect, two different current levels are produced by changing the voltage used to charge the capacitors of the voltage multiplier stages.

14 Claims, 9 Drawing Sheets

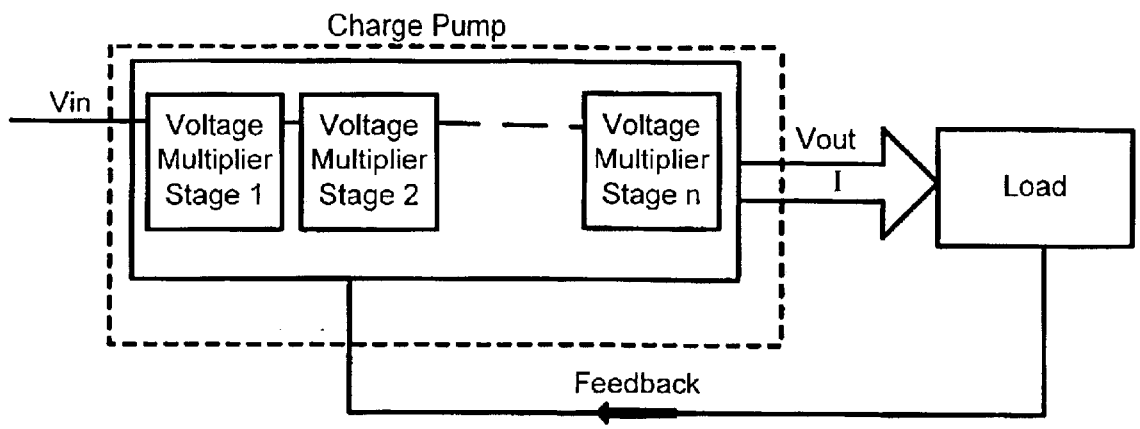
FIG. 1 *(Prior art)*
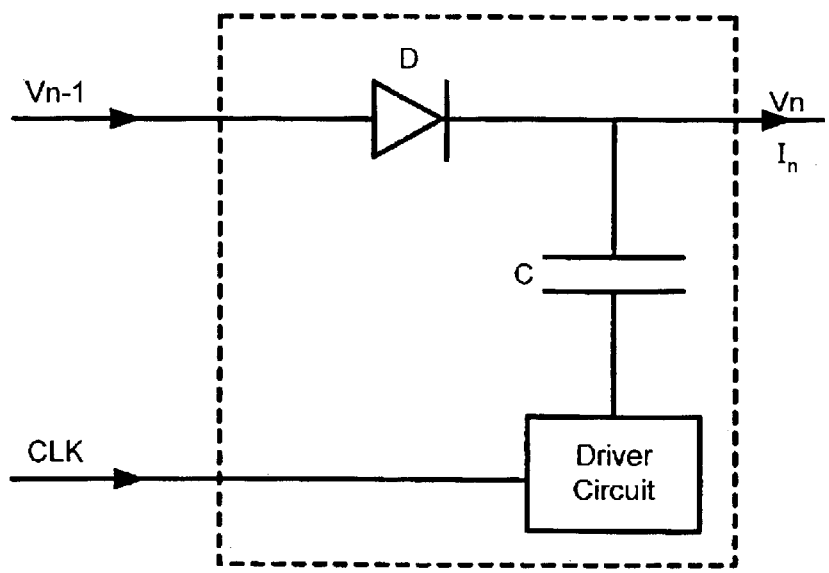
FIG. 2 *(Prior art)*

HIGH VOLTAGE RIPPLE REDUCTION

FIELD OF THE INVENTION

This invention relates generally to non-volatile semiconductor memory such as electrically erasable programmable read-only memory (EEPROM) and flash EEPROM, and specifically to circuits and techniques for supplying power for operating flash EEPROMs.

BACKGROUND OF THE INVENTION

Solid-state memory capable of nonvolatile storage of charge, particularly in the form of EEPROM and flash EEPROM, has recently become the storage of choice in a variety of mobile and handheld devices, notably information appliances and consumer electronics products. Unlike RAM (random access memory) that is also solid-state memory, flash memory is non-volatile, retaining its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On (he other hand, flash memory, particularly in the form of memory cards, is ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells.

A flash EEPROM allows a group of memory cells to be erased together. These devices contain memory cells each having a storage element in the form of a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charge and therefore an EPROM memory cell can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell. An NROM has a similar structure except its storage element is a dielectric layer instead of a floating gate.

Clearly, it is advantageous to have higher numbers of memory states providing greater memory storage density. This requires higher numbers of resolvable threshold voltages. Hence, a power supply must provide precise voltage during programming and reading of the memory cells. Fluctuations in the applied voltage may cause errors in the data being stored if the fluctuations exceed the voltage range for the corresponding memory state.

Also, to improve performance, a large number of memory cells are operated in parallel. This too puts great demands on the power supply. For example, in order to perform a program operation on a row of memory cells whose control gates are connected by the same wordline, the wordline voltage must be raised from a first voltage (e.g. 0V) to a second voltage (e.g. 12–18V) as quickly as possible. The wordline with all the connected control gates may be regarded as a capacitor. Thus, it is equivalent to charging a capacitor from a first voltage to a second voltage.

Program voltage levels used in EPROM memory circuits are higher than the voltages normally used in memory circuits. They are often higher than the voltage supplied to the circuit. These higher voltages are preferably produced within the memory circuit by a charge pump, which in one example essentially dumps charge into the capacitive wordline to charge it to a higher voltage.

FIG. 1. illustrates schematically a charge pump typical of the prior art. The charge pump receives an input at a voltage $V_{in}$ and provides an output at a higher voltage $V_{out}$ by boosting the input voltage progressively in a series of voltage multiplier stages. The voltage output is supplied to a load, for example the word line of an EPROM memory circuit. FIG. 1 also shows a feedback signal from the load to the charge pump. The conventional prior art pump turns off in response to a signal indicating that the load has reached a predetermined voltage. Alternatively, a shunt is used to prevent overcharging once the load reaches the predetermined voltage. However, this consumes more power and is undesirable in low power applications.

FIG. 2 illustrates schematically a voltage multiplier stage of the prior art. The stage pumps charge in response to a clock signal shown as "CLK." When the clock signal is at a low portion of the clock cycle (e.g. 0V) the driver circuit output is LOW. This means that the lower terminal of capacitor C is at 0 volts. An input supplies a voltage $V_{n-1}$ through the diode D and provides approximately $V_{n-1}$ to the upper terminal of C (ignoring the voltage drop across the diode, D). This will deposit a charge Q on the capacitor, where $Q=CV_{n-1}$ When the clock signal transitions to a high state the output of the driver circuit is high, for example $V_{CLK}$ and so the lower terminal of C is at $V_{CLK}$. This will force the upper terminal of C to be $(V_{n-1}+\Delta V_{CLK})$ since charge, Q, is conserved and C is constant. Thus the output voltage of the voltage multiplier stage is: $V_n=V_{n-1}+\Delta V_{CLK}$. The driver will drive one side of the capacitor to Vclk, however because of parasitic capacitance the other side will be increased by $\Delta V_{CLK}$, a voltage less than $V_{CLK}$.

FIG. 3 illustrates the regulated output voltage of a typical charge pump of the prior art while maintaining a voltage $V_{pp}$. When the output voltage falls below a margin of $V_{pp}$, the pump is turned on. The pump delivers a high current to the load and drives the voltage higher than $V_{pp}$. The pump then switches off in response to a feedback signal from the load. The voltage on the load then drops due to leakage current until it reaches a predetermined voltage, lower than $V_{pp}$ by a fixed amount. Then the charge pump switches on again. This cycle produces the ripples in voltage shown. If these ripples (shown by $\Delta V$) are large they may cause problems by programming a floating gate to the wrong voltage level, or by causing a greater variation in program levels. Previous attempts to regulate the output of charge pump circuits include modifying the clock signal, see U.S. Pat. No. 6,188,590 B1 to Chang et al.

Because voltage ripples may cause errors in EPROM memory circuits, and prior art charge pumps generally give an output with significant ripples, there is a need for a charge pump with ripple reduction capability.

SUMMARY AND OBJECTS OF THE INVENTION

Accordingly, it is a general object of the present invention to provide a charge pump with ripple reduction capability. In particular, it is an object to provide a charge pump for supplying power to the wordlines of flash EEPROMs such that the wordline may be rapidly charged to a desired level and may then be maintained at that level with a high degree of stability.

In particular, ripple reduction is achieved by an adaptive charge pump having adaptive voltage multiplier stages. These stages are capable of producing different current output in different modes. A high current output is produced in a first mode. This provides charge to the load very rapidly and so allows for high-speed programming. A low current is produced in a second mode. This provides enough charge to the load to maintain the required voltage without overshooting.

In a first embodiment the current is controlled by modifying the capacitance used in the voltage multiplier stage. Because the quantity of charge pumped at each clock cycle is proportional to the capacitor size, reducing the capacitance reduces the charge pumped and therefore the current. The capacitance is modified by configuring capacitors in parallel and enabling or disabling as many individual capacitors as needed. In the preferred embodiment two capacitors are used. Both are enabled during mode 1 to produce a high current. Then, one capacitor is disabled in mode 2 to reduce the current. The change from mode 1 to mode 2 may be triggered by a voltage detector that detects when the voltage on the load reaches the required level, or comes within a certain margin of the predetermined level.

In a second embodiment the current output of a voltage multiplier stage is controlled by an adaptive driver circuit. This circuit provides a voltage to a capacitor at either a high voltage or a low voltage. A higher voltage drives more charge, that is, it provides a higher current for mode 1. Lower voltage drives less charge in mode 2.

In a third embodiment the current output is controlled by a combination of modifying the capacitance of the voltage multiplier stage and using an adaptive driver circuit. This requires an adaptive driver circuit that may also disable the capacitor.

In another embodiment, in order to provide a stable current in mode 2 a clamp regulation circuit is used to provide a driver output that is independent of fluctuations in the supply voltage.

In another embodiment, a driver protection circuit is provided that protects driver circuits when they are disabled. In the disabled state drivers are susceptible to voltages coupled through their respective capacitors onto their output lines. If these voltages are large they may cause damage. A driver protection circuit clamps the voltage at the output line to prevent such damage.

Additional objects, features and advantages of the present invention will be understood from the following description of its preferred embodiments, which description should be taken in conjunction with the accompanying drawings.

BRIEF DESCRIPTION OF THE DRAWINGS

FIG. 1 illustrates a charge pump of the prior art.

FIG. 2 illustrates a voltage multiplier stage of the prior art.

FIG. 5(*b*) illustrates the current output of an adaptive charge pump of the present invention.

FIG. 8(*b*) illustrates the voltage output of an adaptive driver circuit of the present invention in mode 2.

DESCRIPTION OF THE PREFERRED EMBODIMENTS

Figure 3:
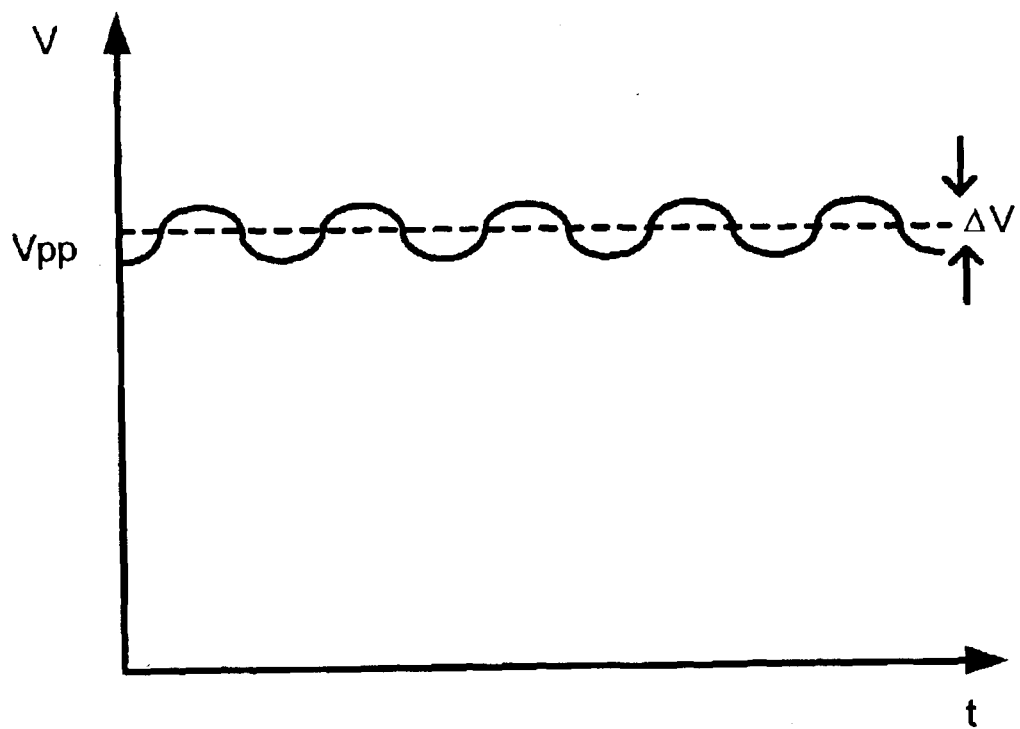
FIG. 3 illustrates the voltage output of a typical charge pump of the prior art.
Figure 4:
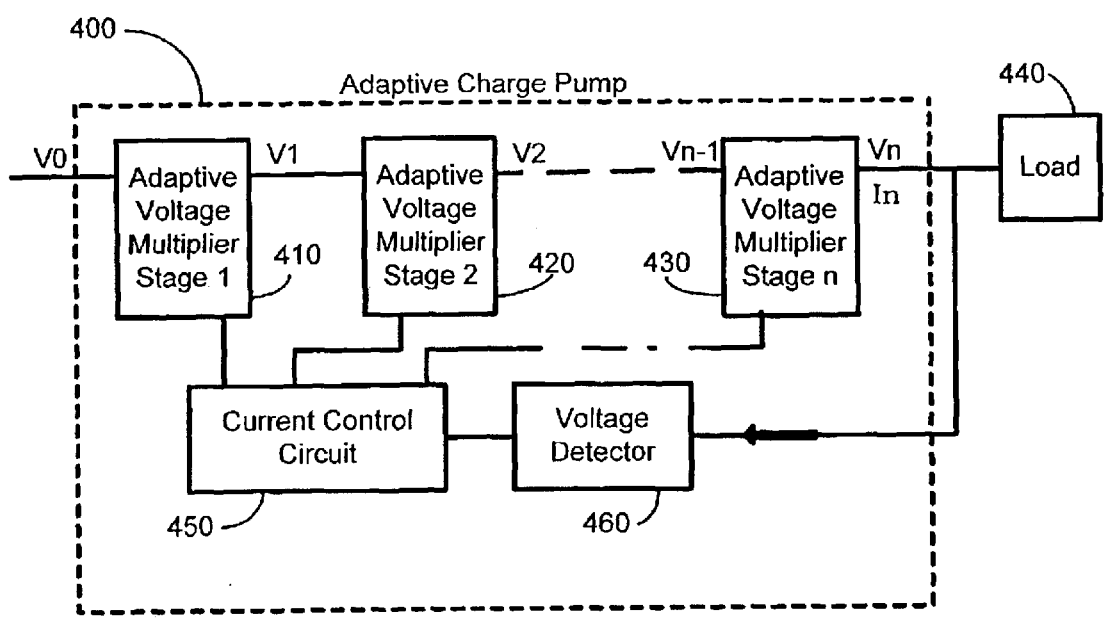
FIG. 4 illustrates an adaptive charge pump of the present invention.

FIG. 4 illustrates schematically an adaptive charge pump 400 of the present invention. The charge pump 400 has n adaptive voltage multiplier stages 410–430 to boost the voltage from the incoming voltage $V_0$ to an output voltage $V_n$, a voltage detector 460 to detect the voltage on the load 440, and a current control circuit 450 that receives an electrical signal from the voltage detector and configures the adaptive voltage multiplier stages in response. For example, the voltage detector 460 may send an electrical signal when the load 440 reaches a predetermined voltage level, or within some margin of a predetermined voltage level. The current control circuit 450 receives this signal and modifies the voltage multiplier stages 410–430 as described below so that the stages produce less current output $I_n$. Reducing current output after the predetermined voltage is reached reduces the ripple effect.

Figure 5A:
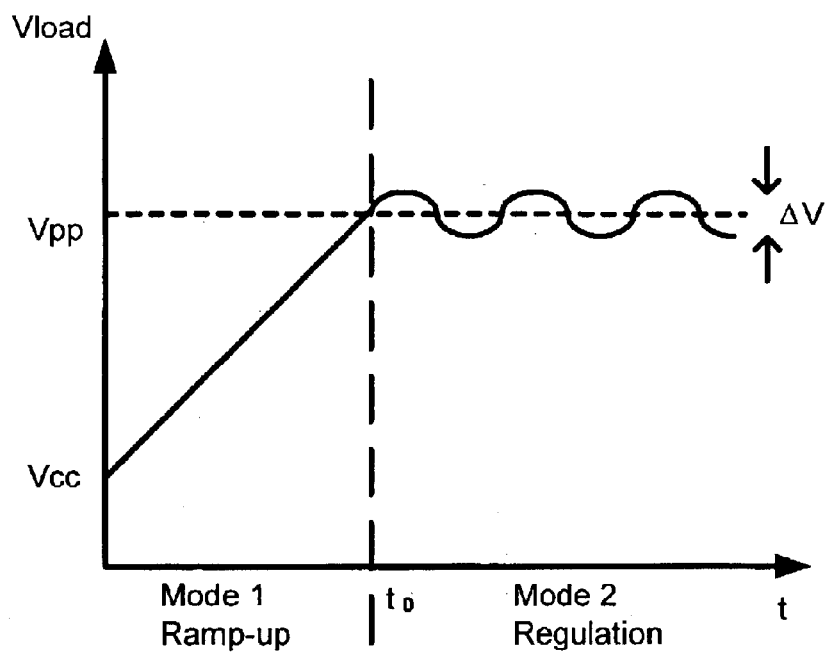
FIG. 5(*a*) illustrates the voltage output of an adaptive charge pump of the present invention.
Figure 5B:
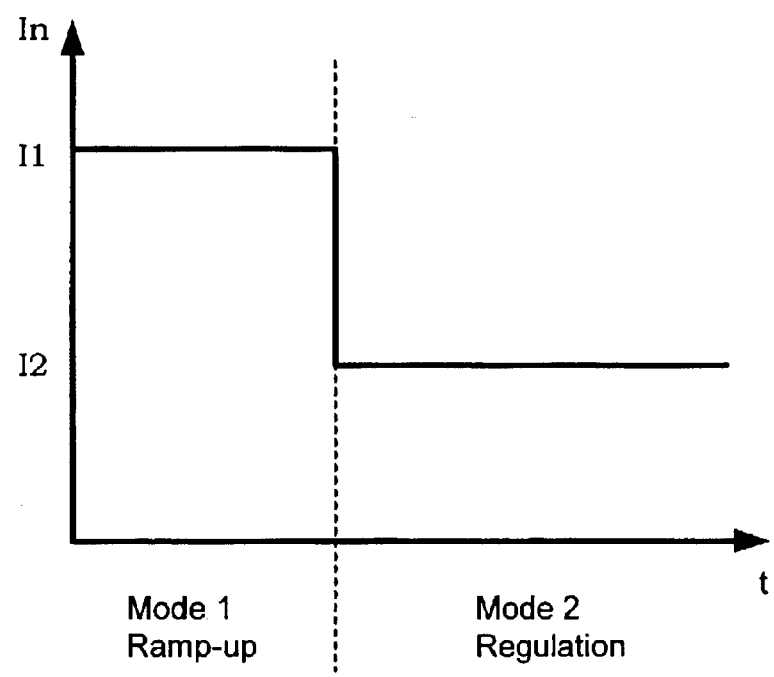

FIGS. 5(*a*) and 5(*b*) illustrate the voltage on the load and the current output of the charge pump respectively. Two modes of operation are illustrated. Mode 1 is the ramp-up mode during which the load is brought to a predetermined voltage. This requires a large current, $I_1$, to charge the load to the required voltage as rapidly as possible. The figure shows an example of charging up a load (e.g. a wordline) from $V_{cc}$ to $V_{pp}$ in a time $t_0$. Mode 2 is the regulation mode during which the voltage is held as closely as possible to the required voltage, $V_{pp}$. That is, $\Delta V$ in FIG. 5(*a*) is made as small as possible. This requires a small current, $I_2$, because a large current deposits a large quantum of charge each time the pump is turned on. The charge pump of the present invention can provide either a high current, $I_1$, or a low current, $I_2$, depending on whether the load has reached a predetermined voltage. The voltage at the load is detected and when the predetermined voltage is reached the pump switches from mode 1 to mode 2.

Figure 6:
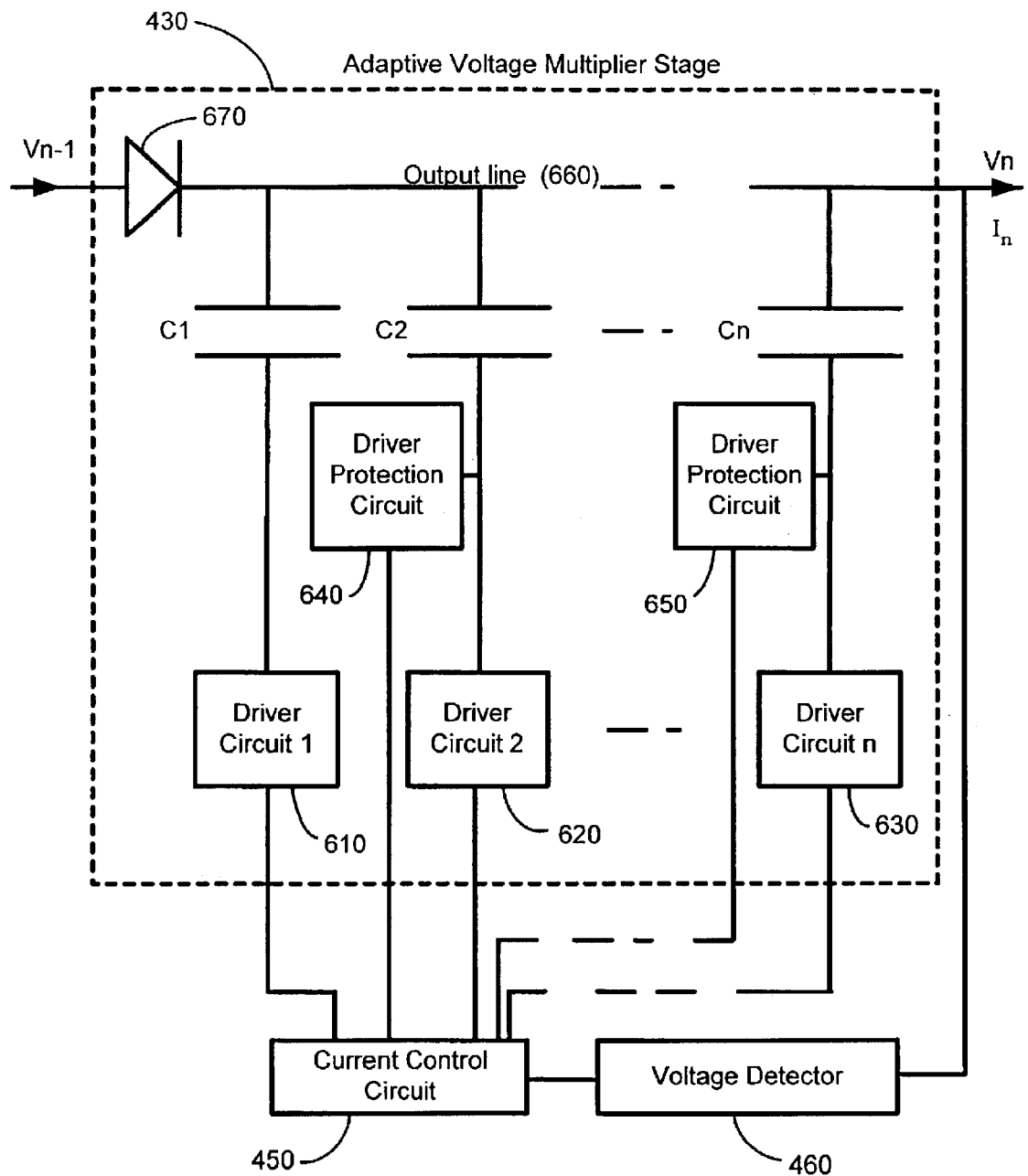
FIG. 6 illustrates an adaptive voltage multiplier stage of the present invention

FIG. 6 illustrates schematically a first embodiment of the present invention. This is an adaptive voltage multiplier stage 430 with controlled current output. This stage has a diode 670 and several capacitors C1–Cn connected in parallel instead of the single capacitor C of the prior art shown in FIG. 2. Each capacitor C1–Cn has a corresponding driver circuit 610–630. These capacitors may be enabled or disabled by the current control circuit 450 in response to a signal from the voltage detector 460. Enabled capacitors operate like the capacitor C of FIG. 2. Disabled capacitors are no longer active in the voltage multiplier stage. By disabling capacitors, the capacitance used in the adaptive voltage multiplier stage may be reduced. This reduces the charge stored according to the equation: Q=CV. With less charge stored, less charge is pumped from the stage on each clock cycle. The result is less charge pumped per unit time, that is, less current output.

Drivers for disabled capacitors do not supply current to their corresponding capacitors. However, the drivers remain connected to the capacitors and the capacitors are connected together at the output line 660. Voltages may be coupled from the output line 660 through disabled capacitors to their driver circuits. If such coupled voltages are large enough they may damage the driver circuits. Protection circuits 640–650 are shown connected to the driver outputs to prevent such damage. These protection circuits are controlled by the current control circuit 450 and are turned on when the corresponding capacitor is disabled. Driver circuit 1 610 does not have a driver protection circuit. This is because C1 is always enabled in this example and therefore does not require protection. The driver protection circuit is further described below.

The preferred embodiment of this invention produces two levels of current output. Therefore, two capacitors are used in the adaptive voltage multiplier stage. One capacitor is disabled when the predetermined voltage is reached. The remaining capacitor is selected so the current output produced maintains the predetermined voltage. That is, the current is equal to the leakage from the load at that voltage.

Figure 7:
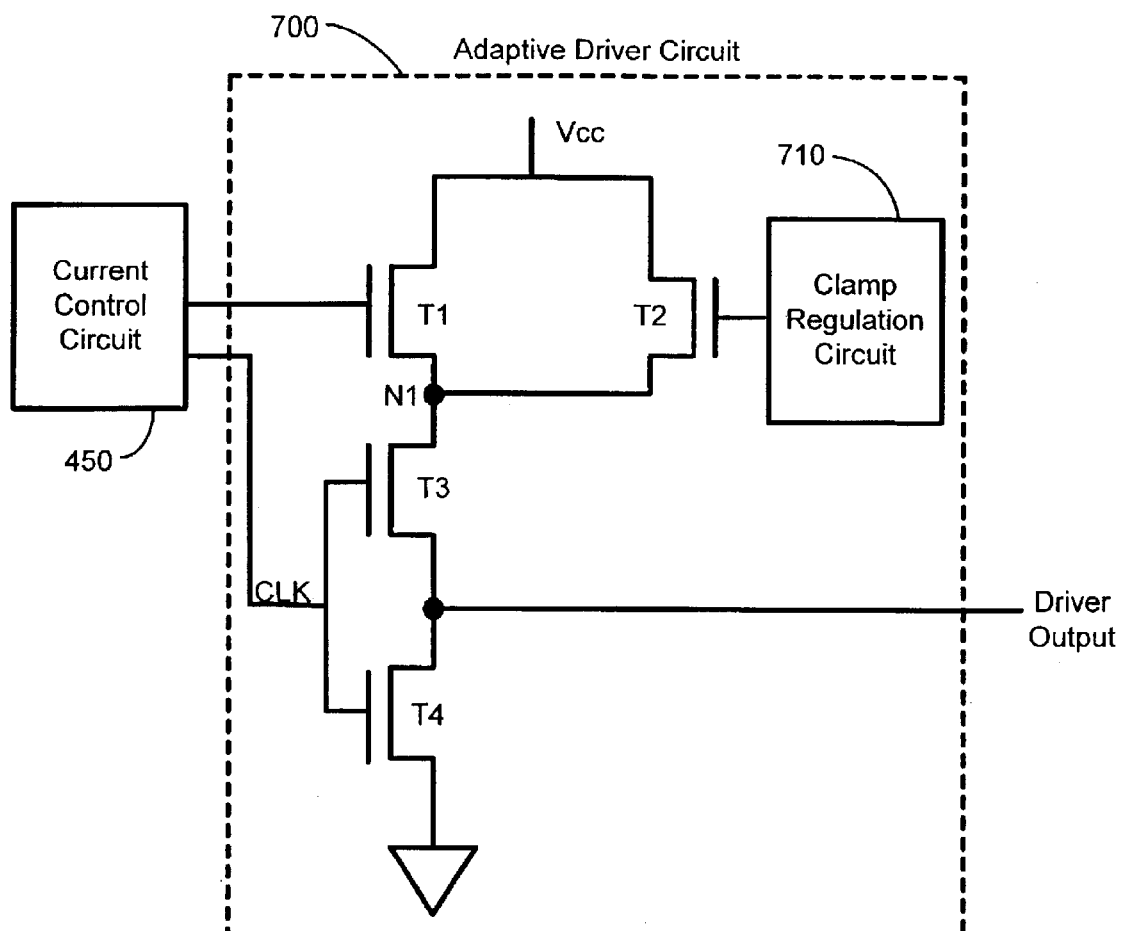
FIG. 7 illustrates an adaptive driver circuit of the present invention.

FIG. 7 illustrates a second embodiment of the present invention. This embodiment provides a second means to control the current output by using an adaptive driver circuit 700. This may be used in place of the driver circuit shown in FIG. 2, or driver circuit 1 610 of FIG. 6. This is a driver circuit that has two possible levels of output voltage. The voltage supply, $V_{cc}$, goes to two transistors, $T_1$ and $T_2$. The first transistor, $T_1$ is configured to provide a high voltage (approximately $V_{cc}$) at node N1. Transistor T1 is controlled by the current control circuit 450. It is turned on in mode 1, and turned off in mode 2. The second transistor, $T_2$, is configured to provide a lower voltage at node N1 when T1 is turned off The gate of $T_2$ is controlled by the clamp regulation circuit 710 to provide a constant, low voltage at N1. This, in turn, lowers the output of the driver circuit. The effect of providing a lower voltage to the capacitor is to drive less charge through the stage on each clock cycle. Therefore, the current output of the stage is reduced.

Figure 8A:
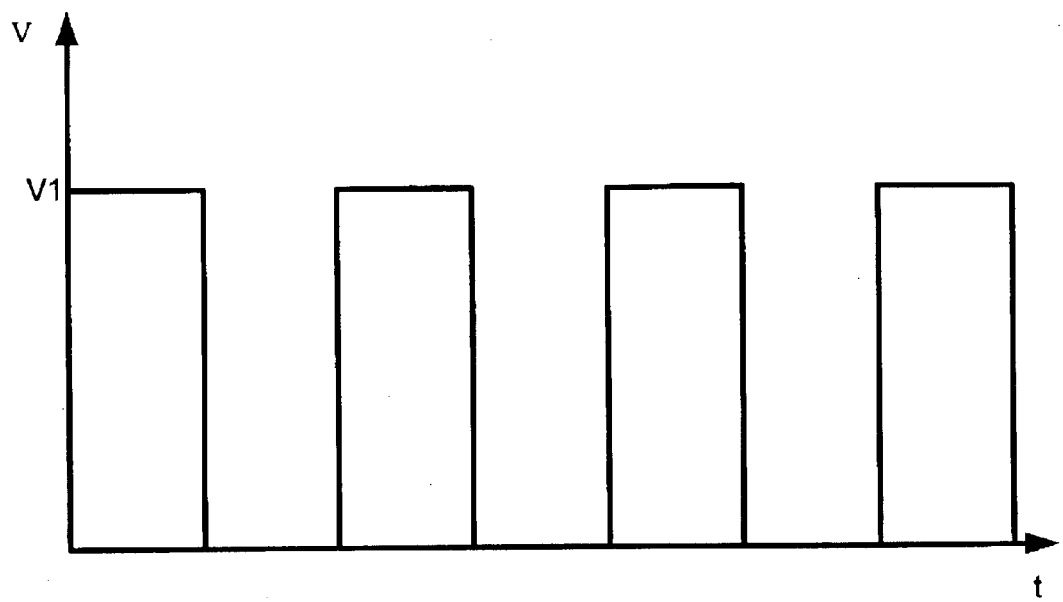
FIG. 8(*a*) illustrates the voltage output of an adaptive driver circuit of the present invention in mode 1.
Figure 8B:
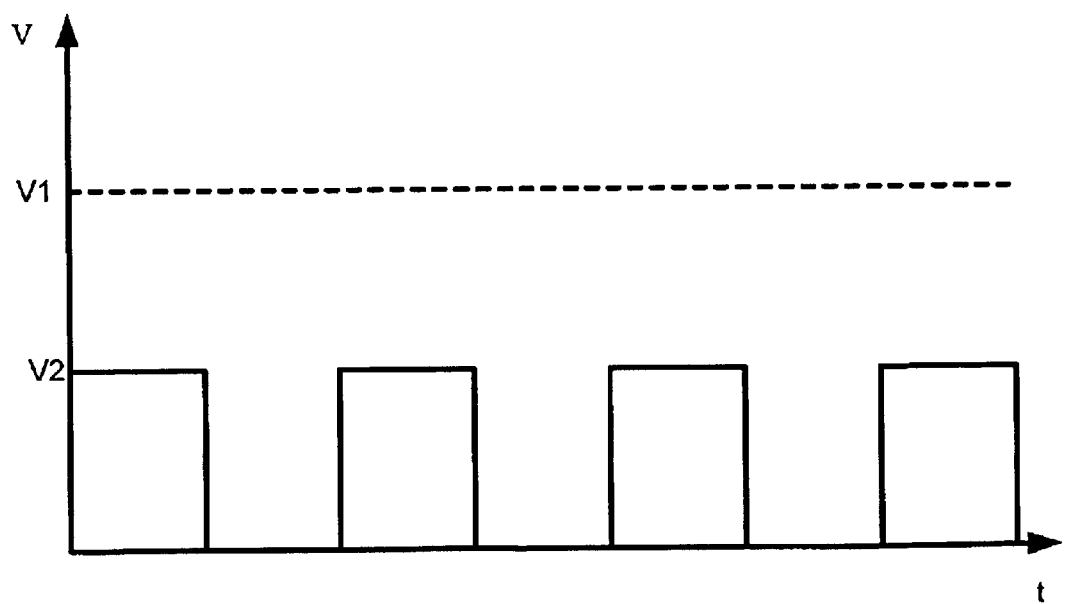

FIGS. 8(a) and 8(b) illustrate the voltage output from the adaptive driver circuit in mode 1 and mode 2 respectively. In mode 1 the adaptive driver circuit gives a voltage output of $V_1$, where $V_1$ is approximately $V_{cc}$. In mode 2 the adaptive driver circuit gives a voltage output of $V_2$ that is lower than $V_1$. This reduced voltage from the adaptive driver circuit results in less charge being pumped to the next stage of the pump, that is, lower current output.

The first and second embodiments are alternative methods of achieving controlled current output from the charge pump. These two methods may be combined in a third embodiment to give more control and to allow multiple current levels. For example, the current output could be reduced by a first amount when the voltage approaches the predetermined level and then further reduced when the voltage is equal to the predetermined level. The third embodiment is an adaptive voltage multiplier stage using both variable capacitance and an adaptive driver circuit. This requires an adaptive driver circuit that can provide an output to the capacitor at two different voltages and can also disable the capacitor.

Figure 9:
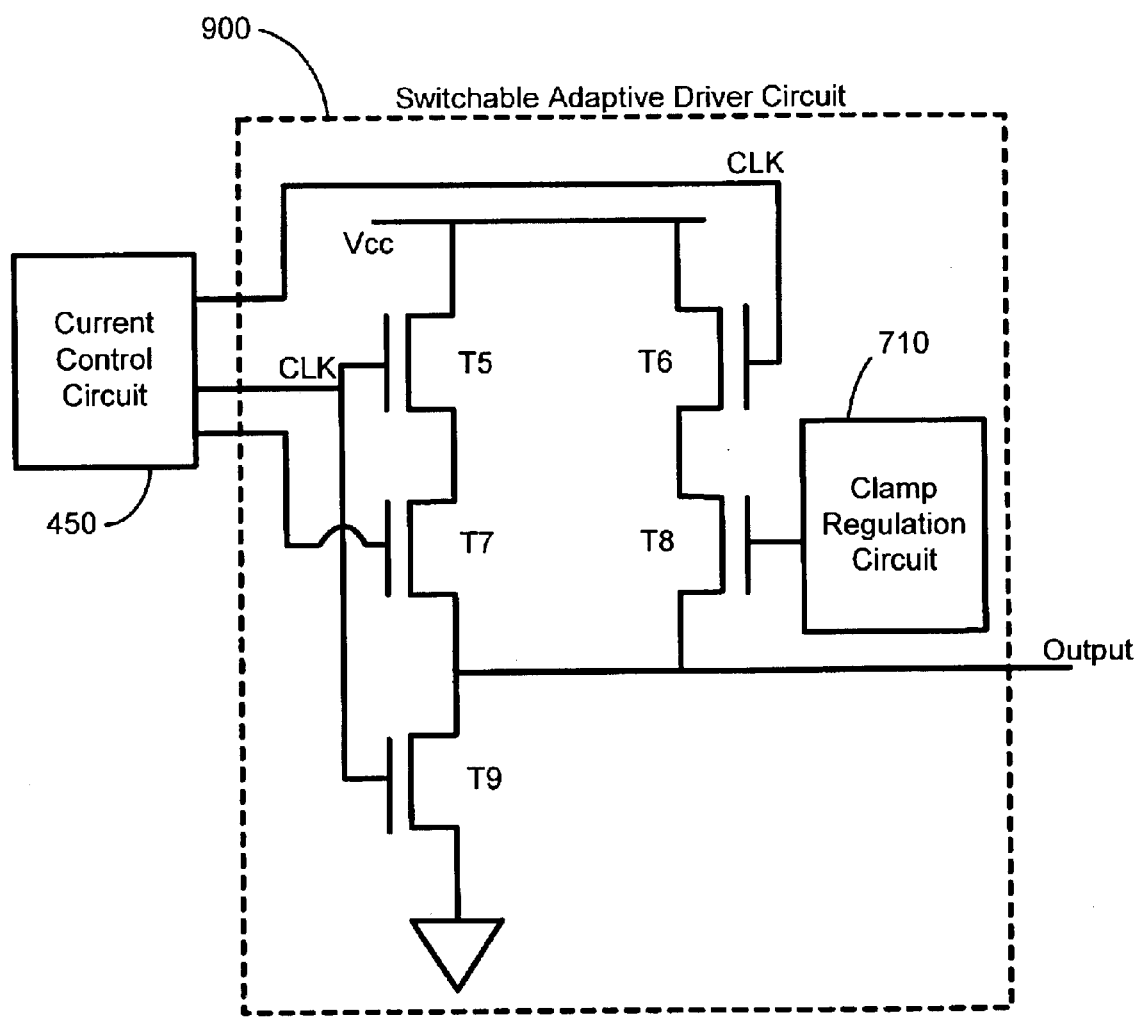
FIG. 9 illustrates a switchable adaptive driver circuit of the present invention.

FIG. 9 illustrates a driver circuit of the third embodiment. This is a switchable adaptive driver circuit 900. This may be used as driver circuit 2—driver circuit n (620–630) in FIG. 6. This circuit is similar to the adaptive driver circuit 700 shown in FIG. 7. It has two parallel voltage supplies from Vcc. One branch is controlled by the current control circuit 450 to provide a high voltage output in mode 1. The other branch is regulated by the clamp regulation circuit 710 to provide a reduced voltage output in mode 2. However the transistors in this circuit are arranged so that $T_7$ and $T_8$ are directly connected to the driver output. The driver output is susceptible to voltages coupled through the capacitor when the capacitor is disabled. Transistors $T_7$, $T_8$ and $T_9$ are all N-channel devices and so only N-channel devices are directly connected to the driver output in this configuration. This allows the driver output voltage to be held at a particular voltage level that is selected to reduce the risk of damage to N-channel devices.

Figure 10:
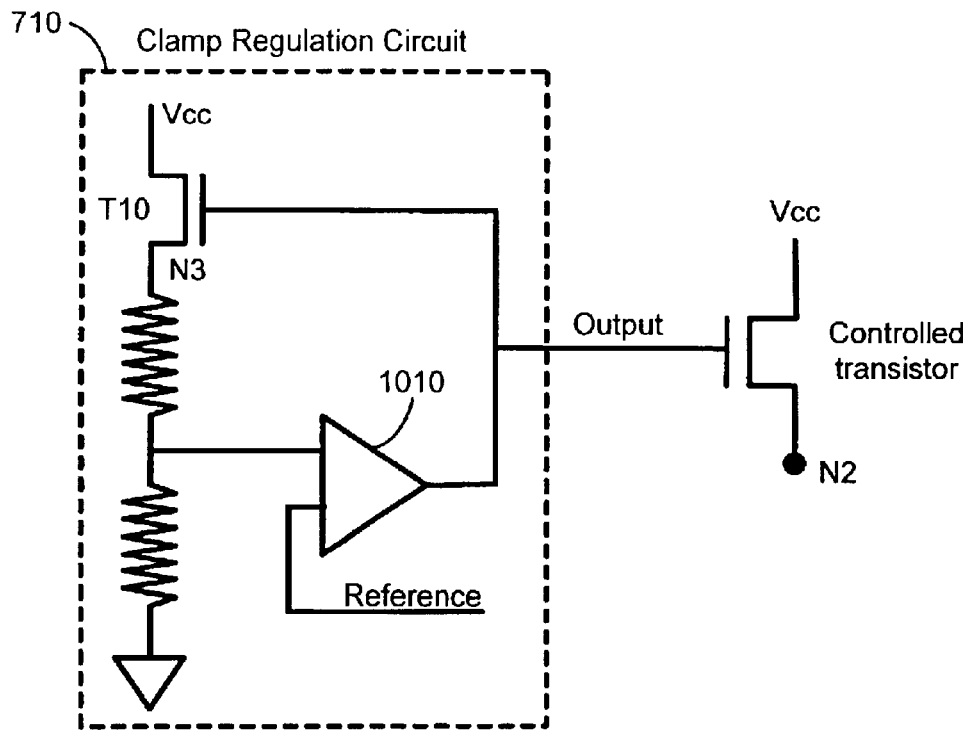
FIG. 10 illustrates a clamp regulation circuit of the present invention.

FIG. 10 illustrates the clamp regulation circuit 710 of the present embodiment. This circuit controls the gate voltage of a controlled transistor, for example transistor $T_2$ in FIG. 7 or $T_8$ in FIG. 9, to provide a constant voltage output in mode 2. The circuit clamps the voltage at the node N2 to be largely independent of the voltage supplied, that is, independent of variation in $V_{cc}$. The transistor $T_{10}$ is chosen to be identical to the controlled transistor. Any change in the voltage supply, $V_{cc}$, causes the voltage input to the op-amp 1010 to change. The output then changes the voltage on the gate of $T_{10}$ and thus the resistance of $T_{10}$. This returns the voltage at the input of the op-amp to near its original level. The circuit maintains a constant voltage at node N3. Because the controlled transistor is identical to $T_{10}$ and is controlled by the same gate voltage, the controlled transistor maintains a constant voltage at node N2. This prevents fluctuations in the supply voltage, $V_{cc}$, affecting the output of the voltage multiplier stage in mode 2.

Figure 11:
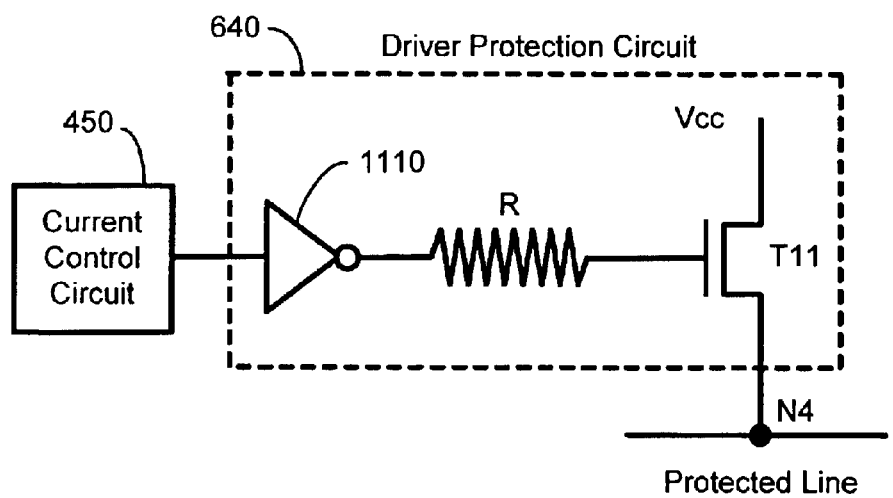
FIG. 11 illustrates a driver protection circuit of the present invention.

FIG. 11 illustrates a driver protection circuit 640 of the present invention. The driver protection circuit is connected as shown in FIG. 6. When a capacitor such as C2 in FIG. 6 is disabled the driver circuit 620 no longer applies a voltage to the lower terminal of the capacitor. However, voltages are applied to other capacitors in parallel, such as C1, that are connected to the same output line 660 as the disabled capacitor C2. These voltages may be coupled through the disabled capacitor C2 to the driver circuit 620. If the voltages are large then they may cause reverse biasing of the transistors of the driver circuit 620 and so damage the transistors. To prevent this, the driver protection circuit 640 holds the node at the output of the driver circuit 620 at a fixed voltage when the corresponding capacitor C2 is disabled. The fixed voltage is some intermediate voltage between ground and the supply voltage, $V_{cc}$. The voltage is held by connecting a transistor T11 between the supply voltage, $V_{cc}$, and the node N4. The gate voltage of T11 is regulated to maintain the required voltage at the node N4.

The gate voltage of this transistor is controlled by a driver 1110 that is also susceptible to damage from voltages coupled through the capacitor and the gate of transistor T11. To protect the driver 1110 from such voltages, a resistor R is inserted between the driver and the gate of transistor $T_{11}$. The resistance of R is chosen to provide a sufficient voltage drop across the resistor R that the largest anticipated voltage at the gate does not result in a high enough voltage at the output of the driver 1110 to cause damage.

What is claimed is:

1. A charge pump for charging a load to a predetermined voltage and maintaining the predetermined voltage on the load, comprising:
   one or more voltage multiplier stages coupled to increase a base voltage, and at least one said stage further comprising:
   a plurality of configurable capacitors to allow different quantities of charge to be pumped from the stage during a clock cycle.

2. The charge pump of claim 1 wherein at least one voltage multiplier stage comprises a first capacitor and a second capacitor;
   said first and second capacitors being enabled in a first mode of operation to provide a first current; and
   said first capacitor being enabled and said second capacitor being disabled in a second mode of operation so as to give a lower charge output per clock cycle in said second mode than in said first mode, thereby providing a lower second current in said second mode than in said first mode.

3. The charge pump of claim 2 wherein the first capacitor is selected to provide a current output from the charge pump in the second mode approximately equal to the current required to maintain said predetermined voltage.

4. The charge pump of claim 2 wherein the pump mode changes from the first mode to the second mode when the voltage on the load reaches within a predetermined margin of the predetermined voltage.

5. The charge pump of claim 1 wherein at least one of said capacitors is electrically connected to a driver circuit;
   said driver circuit is protected from high voltages coupled through said capacitor by a protection circuit that can restrict the voltage at the output of the driver circuit to within a predetermined range.

6. A charge pump for charging a load to a predetermined voltage and maintaining the voltage on the load, comprising:
   a plurality of voltage multiplier stages coupled to increase a base voltage, at least one stage further comprising:
   a driver circuit having a switchable first voltage supply to provide current at a first voltage in a first mode of operation and switch off in a second mode of operation;
   a regulated second voltage supply to provide a constant second voltage in a second mode of operation; and
   wherein said second voltage is selected to provide a current output from the charge pump approximately equal to the current necessary to maintain said predetermined voltage on said load.

7. The charge pump of claim 6 further comprising a clamp regulation circuit to maintain said constant second voltage by regulating the voltage applied to the gate of a clamp transistor so that the drain of said clamp transistor is kept at a second voltage substantially independent of fluctuations in the voltage supplied to the source of the transistor.

8. A charge pump for charging a load to a predetermined voltage and maintaining the voltage on the load, comprising:
   a plurality of voltage multiplier stages coupled to increase a base voltage, at least one stage further comprising:
   a variable capacitance provided by a plurality of configurable capacitors;
   each of said capacitors being electrically connected to a driver circuit;
   said driver circuit having a switchable first voltage supply to provide current at a first voltage in a first mode of operation and switch off in a second mode of operation; and
   a regulated second voltage supply to provide a constant second voltage in a second mode of operation.

9. A protection circuit for restricting the voltage at a node to protect devices connected to the node comprising a transistor, a driver circuit and a resistor;
   said transistor having a source connected to a supply voltage, a drain connected to the node, and a gate connected to the output of the driver through the resistor.

10. The protection circuit of claim 9 wherein said transistor is an N-channel MOSFET.

11. The protection circuit of claim 9 wherein said resistor is selected to reduce the voltage range at the output of the driver circuit to a range selected to prevent damage to the transistors of the driver circuit when a voltage is coupled through the protected node to the gate of the transistor.

12. A charge pump for charging a load to a predetermined voltage and maintaining the voltage on the load, comprising:
   a means for increasing voltage from a base voltage to an output voltage by means of a charge pump;
   a means for detecting the voltage on the load and returning an electrical signal to the charge pump when the load reaches a predetermined voltage; and
   a means for reducing the capacitance used in one or more stages of the charge pump in response to the signal to provide a reduced current output from the charge pump.

13. A method of charging a load to a predetermined voltage and maintaining the voltage on the load by:
   increasing voltage from a base voltage to an output voltage by means of a charge pump;
   detecting the voltage on the load and returning an electrical signal to the charge pump when the load reaches a predetermined voltage; and
   reducing the capacitance used in one or more stages of the charge pump in response to the signal to provide a reduced current output from the charge pump.

14. A method of charging a load to a predetermined voltage and maintaining the voltage on the load by:
   increasing voltage from a base voltage to an output voltage by means of a charge pump;
   detecting the voltage on the load and returning an electrical signal to the charge pump when the load reaches a predetermined voltage; and
   reducing the voltage used in one or more stages of the charge pump in response to the signal to provide a reduced current output from the charge pump.

* * * * *